United States Patent
Tang

(10) Patent No.: US 12,316,303 B2
(45) Date of Patent: May 27, 2025

(54) SURFACE ACOUSTIC WAVE RESONATOR, FILTER, AND COMMUNICATION DEVICE

(71) Applicant: Newsonic Technologies, Guangdong (CN)

(72) Inventor: Gongbin Tang, Guangdong (CN)

(73) Assignee: Newsonic Technologies, Shenzhen (CN)

( * ) Notice: Subject to any disclaimer, the term of this patent is extended or adjusted under 35 U.S.C. 154(b) by 496 days.

(21) Appl. No.: 17/675,245

(22) Filed: Feb. 18, 2022

(65) Prior Publication Data

US 2022/0173722 A1      Jun. 2, 2022

(51) Int. Cl.
*H03H 9/64* (2006.01)
*H03H 9/02* (2006.01)

(52) U.S. Cl.
CPC ........ *H03H 9/643* (2013.01); *H03H 9/02574* (2013.01); *H03H 9/6453* (2013.01)

(58) Field of Classification Search
CPC ............ H03H 9/6483; H03H 9/02574; H03H 9/02563; H03H 9/6453; H03H 9/643
See application file for complete search history.

(56) References Cited

U.S. PATENT DOCUMENTS

| | | | | |
|---|---|---|---|---|
| 6,359,368 | B1* | 3/2002 | Tsutsumi | H03H 9/02771 333/194 |
| 2011/0309897 | A1* | 12/2011 | Yamanaka | H03H 9/64 333/195 |
| 2012/0182091 | A1* | 7/2012 | Ookubo | H03H 3/08 427/230 |
| 2019/0089324 | A1* | 3/2019 | Challa | H03H 9/14582 |
| 2020/0021267 | A1* | 1/2020 | Swamy | H03H 9/145 |

(Continued)

FOREIGN PATENT DOCUMENTS

| | | | | |
|---|---|---|---|---|
| CN | 1416617 | A * | 5/2003 | H03H 3/08 |
| CN | 102332887 | A | 1/2012 | |
| CN | 112840561 | A * | 5/2021 | H03H 9/02669 |

OTHER PUBLICATIONS

Dmitriev et al. ("Tunable high-Q surface-acoustic-wave resonator", Tech. Phys. 52, 1061-1067 (2007)) (Year: 2007).*

(Continued)

*Primary Examiner* — Yuqing Xiao
*Assistant Examiner* — Christopher Richard Walker
(74) *Attorney, Agent, or Firm* — LEASON ELLIS LLP

(57) ABSTRACT

A surface acoustic wave resonator, a filter and a communication device are provided. The surface acoustic wave resonator includes a piezoelectric material layer, an interdigital transducer and a reflective electrode structure; the piezoelectric material layer includes a first region and two second regions arranged in a first direction; the interdigital transducer is located at a side of the piezoelectric material layer; the reflective electrode structure is arranged in the same layer as the interdigital transducer; the first region is located between two second regions, the interdigital transducer is located in the first region, the reflective electrode structure is located in the second region, and the surface acoustic wave resonator further includes a groove located in the piezoelectric material layer, the groove is located in the second region, and is located at a side of the reflective electrode structure away from the interdigital transducer in the first direction.

14 Claims, 4 Drawing Sheets

(56) References Cited

U.S. PATENT DOCUMENTS

2021/0067136 A1* 3/2021 Fujiwara .............. H03H 9/6489
2022/0200566 A1* 6/2022 Kadota .............. H03H 9/14538

OTHER PUBLICATIONS

CN-1416617-A (Machine Translation) (Year: 2003).*
CN-112840561-A (Machine Translation) (Year: 2021).*
Michio Kadota et al., "Transversely Coupled Resonator Filters Utilizing Reflection of Bleustein-Gulyaev-Shimizu Wave at Free Edges of Substrate", Jpn. J. Appl. Phys. vol. 39 (2000) pp. 3045-3048. Jan. 20, 2020. 4 pages.

* cited by examiner

40

100

200

50

SURFACE ACOUSTIC WAVE RESONATOR, FILTER, AND COMMUNICATION DEVICE

TECHNICAL FIELD

Embodiments of the present disclosure relate to a surface acoustic wave resonator, a filter, and a communication device.

BACKGROUND

With the development of communication technology from 2G to 5G or even 6G, the number of communication bands is gradually increasing (for example, from 4 bands of 2G to more than 50 bands of 5G). Therefore, in order to improve the compatibility of different communication standards, the amount of filters required by communication devices such as smart phones will increase significantly, which will promote the large-scale growth of the filter market.

At present, in the communication devices such as smart phones, the widely used radio frequency filter is surface acoustic wave filter, which can be used to take out signals with specific frequencies from various input radio frequency signals. On the other hand, with the continuous development of communication technology and modular development of radio frequency (RF) front-end, the market demand for filters tends to be complicated, high-end and miniaturized.

SUMMARY

Embodiments of the present disclosure provide a surface acoustic wave resonator, a filter, and a communication device. The surface acoustic wave resonator includes a piezoelectric material layer, an interdigital transducer and a reflective electrode structure. The piezoelectric material layer includes a first region and two second regions arranged in a first direction; the interdigital transducer is located at a side of the piezoelectric material layer; the reflective electrode structure is arranged in the same layer as the interdigital transducer; the first region is located between two second regions, the interdigital transducer is located in the first region, the reflective electrode structure is located in the second region, and the surface acoustic wave resonator further includes a groove located in the piezoelectric material layer, the groove is located in the second region, and is located at a side of the reflective electrode structure away from the interdigital transducer in the first direction. Therefore, the surface acoustic wave resonator partially removes the conventional reflective electrode structure, and forms a groove in the piezoelectric material layer at a side of the remaining reflective electrode structure away from the interdigital transducer, so as to achieve the same reflection effect while reducing the size of the surface acoustic wave resonator, thereby achieving the miniaturization design of the surface acoustic wave resonator.

At least one embodiment of the disclosure provides a surface acoustic wave resonator, comprising: a piezoelectric material layer, comprising a first region and two second regions arranged in a first direction; an interdigital transducer, located at a side of the piezoelectric material layer; and a reflective electrode structure, arranged in the same layer as the interdigital transducer, wherein the first region is located between the two second regions, the interdigital transducer is located in the first region, and the reflective electrode structure is located in the second regions, the surface acoustic wave resonator further comprises a groove located in the piezoelectric material layer, the groove is located in the second regions and at a side of the reflective electrode structure away from the interdigital transducer in the first direction.

For example, in the surface acoustic wave resonator according to an embodiment of the disclosure, a depth of the groove in a direction perpendicular to the piezoelectric material layer ranges from 0.05 L to 0.1 L, where L is a period length of the interdigital transducer.

For example, in the surface acoustic wave resonator according to an embodiment of the disclosure, a depth of the groove in a direction perpendicular to the piezoelectric material layer ranges from 80 nm to 120 nm.

For example, in the surface acoustic wave resonator according to an embodiment of the disclosure, a size of the groove in the first direction is greater than 0.1 L, where L is a period length of the interdigital transducer.

For example, in the surface acoustic wave resonator according to an embodiment of the disclosure, a size of the reflective electrode structure in the first direction ranges from 8 microns to 12 microns.

For example, in the surface acoustic wave resonator according to an embodiment of the disclosure, the interdigital transducer comprises: a first electrode, comprising a plurality of first strip-shaped electrode portions; and a second electrode, comprising a plurality of second strip-shaped electrode portions, wherein each of the plurality of first strip-shaped electrode portions extends along a second direction, each of the plurality of second strip-shaped electrode portions extends along the second direction, the plurality of first strip-shaped electrode portions and the plurality of second strip-shaped electrode portions are arranged in the first direction, and the second direction intersects with the first direction.

For example, in the surface acoustic wave resonator according to an embodiment of the disclosure, a size of the groove in the second direction is approximately the same as a size of the interdigital transducer in the second direction.

For example, in the surface acoustic wave resonator according to an embodiment of the disclosure, the reflective electrode structure comprises a plurality of third strip-shaped electrode portions, and the plurality of third strip-shaped electrode portions are arranged along the first direction.

For example, in the surface acoustic wave resonator according to an embodiment of the disclosure, a number of the plurality of third strip-shaped electrode portions comprised in the reflective electrode structure in each of the second regions ranges from 10 to 20.

For example, in the surface acoustic wave resonator according to an embodiment of the disclosure, the number of the plurality of third strip-shaped electrode portions comprised in the reflective electrode structure in each of the second regions ranges from 14 to 16.

For example, in the surface acoustic wave resonator according to an embodiment of the disclosure, a material of the piezoelectric material layer comprises piezoelectric crystal or piezoelectric ceramic.

For example, in the surface acoustic wave resonator according to an embodiment of the disclosure, a material of the interdigital transducer comprises one or more selected from the group consisting of gold, tungsten, silver, titanium, platinum, aluminum, copper and molybdenum.

At least one embodiment of the disclosure provides a filter, comprising a plurality of resonators, wherein the plurality of resonators comprises at least one surface acoustic wave resonator according to any items as mentioned above.

For example, in the filter according to an embodiment of the disclosure, the plurality of resonators comprise a plurality of surface acoustic wave resonators, the plurality of surface acoustic wave resonators comprises a first surface acoustic wave resonator and a second surface acoustic wave resonator arranged adjacent to each other in the first direction, the first surface acoustic wave resonator and the second surface acoustic wave resonator share one groove.

At least one embodiment of the disclosure provides a communication device, comprising the filter according to any items as mentioned above.

BRIEF DESCRIPTION OF THE DRAWINGS

In order to more clearly illustrate the technical solution of the embodiments of the present disclosure, the drawings of the embodiments will be briefly described in the following. It is obvious that the described drawings below are only related to some embodiments of the present disclosure without constituting any limitation thereto.

DETAILED DESCRIPTION

In order to make objectives, technical details and advantages of the embodiments of the present disclosure more clearly, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

Unless otherwise defined, the features such as "parallel", "vertical" and "same" used in the embodiments of the present disclosure all include strictly "parallel", "vertical" and "same" cases, and cases such as "substantially parallel", "substantially vertical" and "approximately the same" cases with certain errors. For example, the above-mentioned "approximately" may refer to that the difference of the compared objects is within 10% or 5% of the average value of the compared objects. In the case where the number of a component or element is not specifically indicated in the following of the embodiments of the present disclosure, it refers to that the component or element can be one or more, or can be understood as at least one. "At least one" refers to one or more, and "a plurality" refers to at least two. The "disposed in the same layer" in the disclosed embodiment refers to the relationship among multiple film layers formed by the same material after the same step (for example, one-step patterning process). Herein, "the same layer" does not always refer to that the thickness of multiple film layers is the same or the height of multiple film layers in the cross-sectional view is the same.

In the research, the inventor(s) of this application noticed that, with the increasing frequency bands that the RF front-end module needs to support, the interval between adjacent filters is getting smaller and smaller, and the space for placing the RF front-end module inside a communication device such as a smart phone is getting smaller and smaller. Therefore, it is of great significance to reduce the size of resonators and filters and to miniaturize the resonators and filters.

Figure 1:
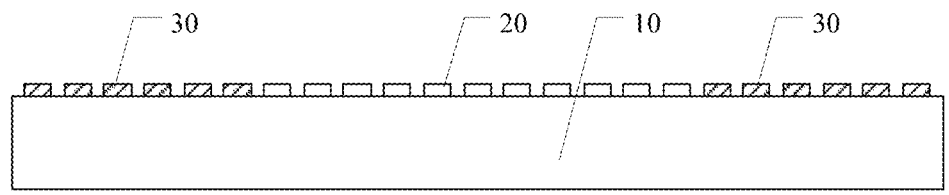
FIG. 1 is a schematic structural diagram of a surface acoustic wave resonator.

FIG. 1 is a schematic structural diagram of a surface acoustic wave resonator. As illustrated by FIG. 1, the surface acoustic wave resonator 40 includes a piezoelectric material layer 10, an interdigital transducer 20 and a reflective electrode structure 30; the interdigital transducer 20 is located at a side of the piezoelectric material layer 10, so as to drive the piezoelectric material layer 10 to generate surface acoustic waves by utilizing the inverse piezoelectric effect; the reflective electrode structure 30 is arranged in the same layer as the interdigital transducer 20 and located on both sides of the interdigital transducer 20. Because the surface acoustic wave resonator needs the reflective electrode structure 30 to reflect surface acoustic wave, and thus has a relatively large size.

Embodiments of the present disclosure provides a surface acoustic wave resonator, a filter and a communication device. The surface acoustic wave resonator includes a piezoelectric material layer, an interdigital transducer and a reflective electrode structure. The piezoelectric material layer includes a first region and two second regions arranged in a first direction. The interdigital transducer is located at a side of the piezoelectric material layer. The reflective electrode structure is arranged in the same layer as the interdigital transducer. The first region is located between two second regions, the interdigital transducer is located in the first region, the reflective electrode structure is located in the second regions, and the surface acoustic wave resonator further includes a groove located in the piezoelectric material layer, the groove is located in the second regions, and is located at the side of the reflective electrode structure away from the interdigital transducer in the first direction. Therefore, the surface acoustic wave resonator partially removes the conventional reflective electrode structure and forms a groove in the piezoelectric material layer at a side of the remaining reflective electrode structure away from the interdigital transducer, so as to achieve the same reflection effect while reducing a size of the surface acoustic wave resonator, thereby achieving the miniaturization design of the surface acoustic wave resonator.

Hereinafter, the surface acoustic wave resonator, the filter and the communication device provided by the embodiments of the present disclosure will be described in detail with reference to the accompanying drawings.

Figure 2:
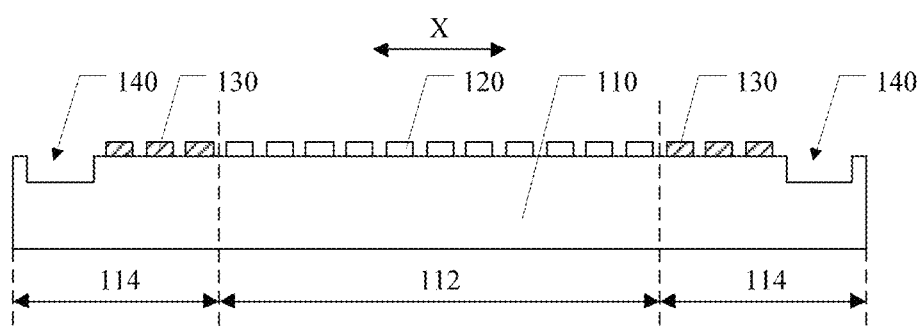
FIG. 2 is a schematic structural diagram of a surface acoustic wave resonator provided by an embodiment of the present disclosure.

An embodiment of the present disclosure provides a surface acoustic wave resonator. FIG. 2 is a schematic structural diagram of a surface acoustic wave resonator provided by an embodiment of the present disclosure. As illustrated by FIG. 2, the surface acoustic wave resonator 100 includes a piezoelectric material layer 110, an interdigital transducer 120, and a reflective electrode structure 130; the piezoelectric material layer 110 includes a first region 112 and two second regions 114 arranged in a first direction X. The first region 112 is located between the two second regions 114. The interdigital transducer 120 is located at a side of the piezoelectric material layer 110 and in the first region 112; the reflective electrode structure 130 is arranged in the same layer as the interdigital transducer 120 and located in the second regions 114. For example, each of the two second regions 114 may be provided with one reflective electrode structure 130. In this case, the interdigital transducer 120 can drive the piezoelectric material layer 110 by utilizing the inverse piezoelectric effect to generate surface acoustic waves, or receive an electrical signal generated by the piezoelectric material layer 110 due to the piezoelectric effect, and the reflective electrode structure 140 can be used to reflect the surface acoustic waves.

As illustrated by FIG. 2, the surface acoustic wave resonator 100 further includes a groove 140 located in the piezoelectric material layer 110, the groove 140 is located in the second region 114, and located at a side of the reflective electrode structure 130 away from the interdigital transducer 120 in the first direction X. It should be noted that the above-mentioned groove includes the case where both sides of the groove are provided with the piezoelectric material layer as the sidewalls, and also includes the case where the piezoelectric material layer located at the side of the groove away from the interdigital transducer is etched and removed.

In the surface acoustic wave resonator provided by the embodiment of the present disclosure, the conventional reflective electrode structure is partially removed, and a groove is formed in the piezoelectric material layer at the side of the remaining reflective electrode structure away from the interdigital transducer. In this case, the groove in the piezoelectric material layer can also reflect the surface acoustic waves, and the reflection coefficient of the groove is larger than the reflection coefficient of the reflective electrode structure, so the size of the reflective electrode structure can be reduced. Therefore, the surface acoustic wave resonator can achieve the same reflection effect while reducing the size of the surface acoustic wave resonator, thereby achieving the miniaturization design of the surface acoustic wave resonator. On the other hand, because the groove in the piezoelectric material layer may generate certain clutter, the surface acoustic wave resonator can effectively suppress the generation of noise by arranging the groove at the side of the reflective electrode structure away from the interdigital transducer, thereby allowing the groove and the reflective electrode structure to play a better role in reflecting surface acoustic waves together.

Figure 3:
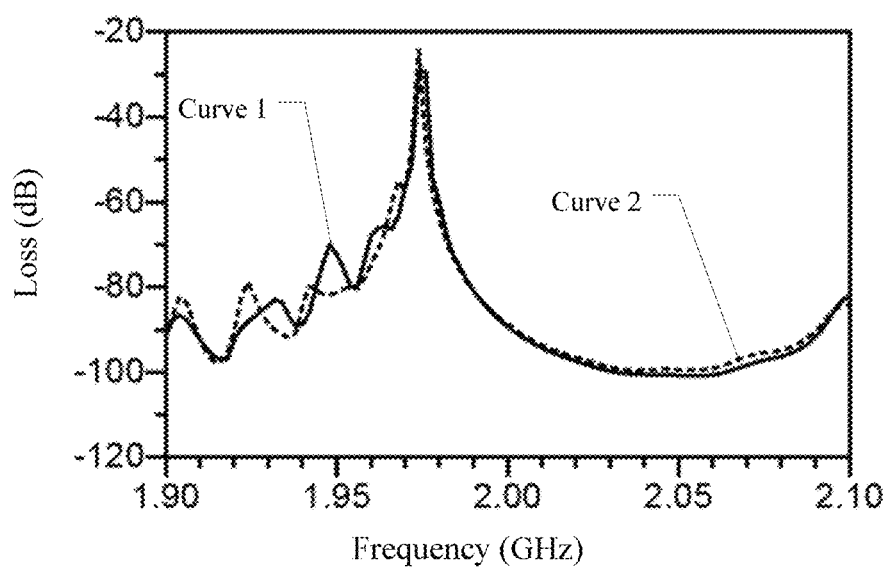
FIG. 3 is a spectrum comparison diagram of a surface acoustic wave resonator provided by an embodiment of the present disclosure and a conventional surface acoustic wave resonator.

FIG. 3 is a spectrum comparison diagram of a conventional surface acoustic wave resonator and a surface acoustic wave resonator provided by an embodiment of the present disclosure. As illustrated by FIG. 3, curve 1 is a frequency response curve of a conventional surface acoustic wave resonator, and curve 2 is a frequency response curve of a surface acoustic wave resonator provided by an embodiment of the present disclosure. It can be seen that the performance of the surface acoustic wave resonator provided by an embodiment of the present disclosure is basically the same as that of the surface acoustic wave resonator without partially removing the reflective electrode structure, and there are no defects such as leakage (for example, leakage along the first direction). Therefore, the surface acoustic wave resonator can achieve the same reflection effect while reducing the size of the surface acoustic wave resonator, thereby achieving the miniaturization design of the surface acoustic wave resonator.

In some examples, as illustrated by FIG. 2, a depth of the groove 140 in a direction perpendicular to the piezoelectric material layer 110 ranges from 0.05 L to 0.1 L, and L is a period length of the interdigital transducer. Therefore, the surface acoustic wave resonator can make the groove have a better reflection effect on surface acoustic waves, and can effectively suppress the generation of noise. In addition, in the case where the depth of the groove in the direction perpendicular to the piezoelectric material layer ranges from 0.05 L to 0.1 L, the surface acoustic wave resonator also has a higher quality factor. It should be noted that the above-mentioned period length L=2 (a+b), a is the width of the strip-shaped electrodes in the interdigital transducer, and b is the width of the interval between two adjacent strip-shaped electrodes. For example, the period length L of the interdigital transducer may be 2-4 microns.

In some examples, as illustrated by FIG. 2, the depth of the groove 140 in the direction perpendicular to the piezoelectric material layer 110 ranges from 80 nm to 120 nm, for example, 100 nm. Therefore, the surface acoustic wave resonator can make the groove have a better reflection effect on surface acoustic waves, and can effectively suppress the generation of noise. In addition, in the case where the depth of the groove in the direction perpendicular to the piezoelectric material layer ranges from 80 nm to 120 nm, the surface acoustic wave resonator also has a higher quality factor.

In some examples, as illustrated by FIG. 2, a size of the groove 140 in the first direction X is greater than 0.1 L, and L is the period length of the interdigital transducer. Therefore, the size of the surface acoustic wave resonator can be effectively reduced, and the miniaturization design of the surface acoustic wave resonator can be achieved. For example, the period length L of the interdigital transducer may be 2-4 microns.

In some examples, as illustrated by FIG. 2, a size of the reflective electrode structure 130 in the first direction ranges from 8 microns to 12 microns. Therefore, the size of the surface acoustic wave resonator can be effectively reduced, and the miniaturization design of the surface acoustic wave resonator can be achieved.

In some examples, a distance between the groove 140 and the reflective electrode structure 130 in the first direction X is 200-300 nm, such as 250 nm.

In some examples, the piezoelectric material layer 110 includes piezoelectric crystal or piezoelectric ceramic. Of course, the embodiments of the present disclosure include but are not limited thereto, and the piezoelectric material layer can also be other types of piezoelectric materials.

In some examples, the material of the piezoelectric material layer 110 may be one or more selected from the group consisting of aluminum nitride (AlN), doped aluminum nitride (doped ALN), zinc oxide (ZnO), lead zirconate titanate (PZT), lithium niobate (LiNbO$_3$), quartz, potassium niobate (KNbO$_3$) and lithium tantalate (LiTaO$_3$). Of course, the embodiments of the present disclosure include, but are not limited thereto, the piezoelectric material layer can also be a composite structure of piezoelectric films, such as a composite structure of a lithium tantalate piezoelectric film/silicon dioxide/silicon substrate.

In some examples, the material of the interdigital transducer 120 may include one or more selected from the group consisting of gold, tungsten, silver, titanium, platinum, aluminum, copper and molybdenum. Of course, the embodiment of the present disclosure includes but is not limited thereto, and the material of the interdigital transducer can also be other conductive materials.

In some examples, as illustrated by FIG. 2, the cross-sectional shape of the groove 140 may be rectangular. Of course, the embodiments of the present disclosure include but are not limited thereto, and the cross-sectional shape of the groove can be other shapes.

Figure 4:
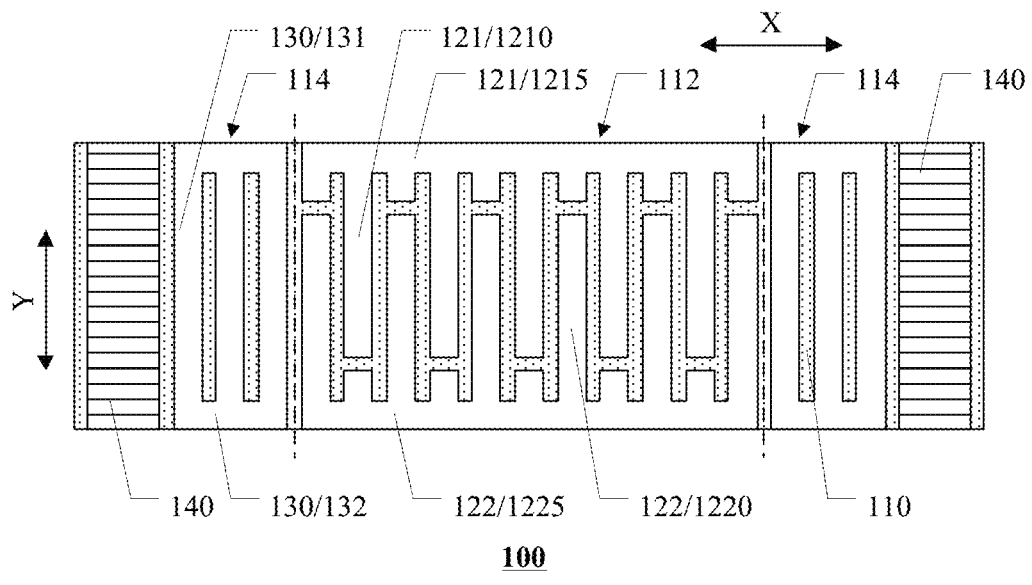
FIG. 4 is a schematic plan view of a surface acoustic wave resonator provided by an embodiment of the present disclosure.

FIG. 4 is a schematic plan view of a surface acoustic wave resonator provided by an embodiment of the present disclosure. As illustrated by FIG. 4, the interdigital transducer 120 includes a first electrode 121 and a second electrode 122; the first electrode 121 includes a plurality of first strip-shaped electrode portions 1210, and the second electrode 122 includes a plurality of second strip-shaped electrode portions 1220. Each of the first strip-shaped electrode portions 1210 extends along the second direction Y, and each of the second strip-shaped electrode portions 1220 extends along the second direction Y. The plurality of first strip-shaped electrode portions 1210 and the plurality of second strip-shaped electrode portions 1220 are arranged in the first direction X, and the second direction intersects with the first direction. It should be noted that the number of strip-shaped electrode portions shown in FIG. 3 is only schematic, and the embodiments of the present disclosure are not specifically limited herein.

For example, the second direction may be perpendicular to the first direction. Of course, embodiments of the present disclosure include but are not limited thereto, and the second direction and the first direction may not be perpendicular to each other.

In some examples, as illustrated by FIG. 4, the plurality of first strip-shaped electrode portions 1210 and the plurality of second strip-shaped electrode portions 1220 are alternately arranged in the second direction. That is, only one second strip-shaped electrode portion 1220 is arranged between two adjacent first strip-shaped electrode portions 1210, and only one first strip-shaped electrode portion 1210 is arranged between two adjacent second strip-shaped electrode portions 1220. In this way, the surface acoustic wave resonator has higher electromechanical coupling coefficient.

In some examples, as illustrated by FIG. 4, the first electrode 121 further includes a first bus bar 1215 connected to ends of the plurality of first strip-shaped electrode portions 1210, thereby forming a comb-like structure; the second electrode 122 further includes a second bus bar 1225 connected to ends of the plurality of second strip-shaped electrode portions 1220, thereby forming a comb-like structure.

In some examples, as illustrated by FIG. 4, a size of the groove 140 in the second direction is approximately the same as a size of the interdigital transducer 120 in the second direction Y. Therefore, the groove 140 can play a better role in reflecting the surface acoustic waves.

It should be noted that the above-mentioned "approximately the same" includes the case where the size of the groove in the second direction is completely the same as the size of the interdigital transducer in the second direction, and also includes the case where the difference between the size of the groove in the second direction and the size of the interdigital transducer in the second direction is less than 5% of an average value of the size of the groove in the second direction and the size of the interdigital transducer in the second direction.

In some examples, as illustrated by FIG. 4, the reflective electrode structure 130 may include a plurality of third strip-shaped electrode portions 131 arranged in the first direction X and third bus bars 132 connecting the plurality of third strip-shaped electrode portions 131, thereby forming an electrode structure having a grid shape.

In some examples, as illustrated by FIG. 4, a number of third strip-shaped electrode portions 131 included in the reflective electrode structure 130 ranges from 10 to 20. Therefore, the reflective electrode structure can have a better reflection effect on surface acoustic waves, and can effectively suppress the generation of noise.

In some examples, as illustrated by FIG. 4, the number of third strip-shaped electrode portions 131 included in the reflective electrode structure 130 ranges from 14 to 16, such as 15. Therefore, the reflective electrode structure can have a better reflection effect on surface acoustic waves, and can effectively suppress the generation of noise.

In some examples, as illustrated by FIG. 4, the size of the first strip-shaped electrode portion 1210 in the first direction X is the same as the size of the second strip-shaped electrode portion 1220 in the first direction X.

In some examples, as illustrated by FIG. 4, the size of the third strip-shaped electrode portion 131 in the first direction X is the same as that of the first strip-shaped electrode portion 1210 in the first direction X.

Figure 5A:
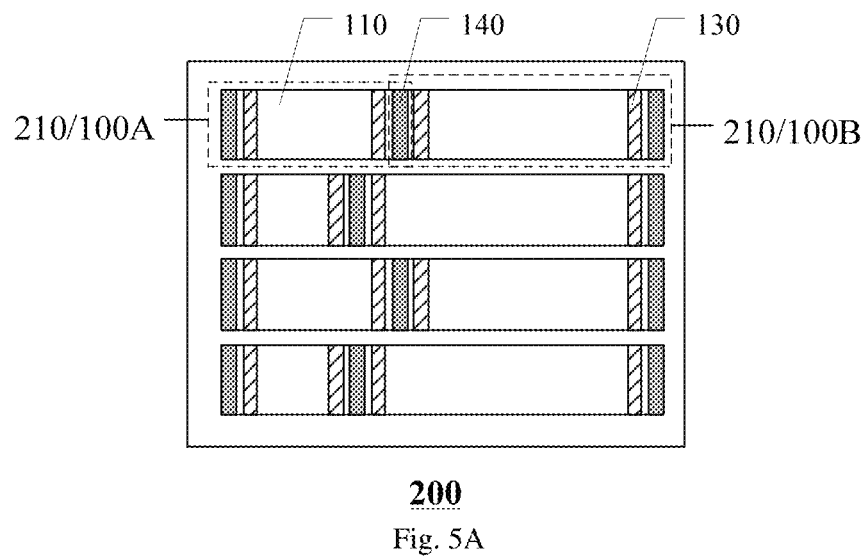
FIG. 5A is a schematic diagram of a filter provided by an embodiment of the present disclosure.
Figure 5B:
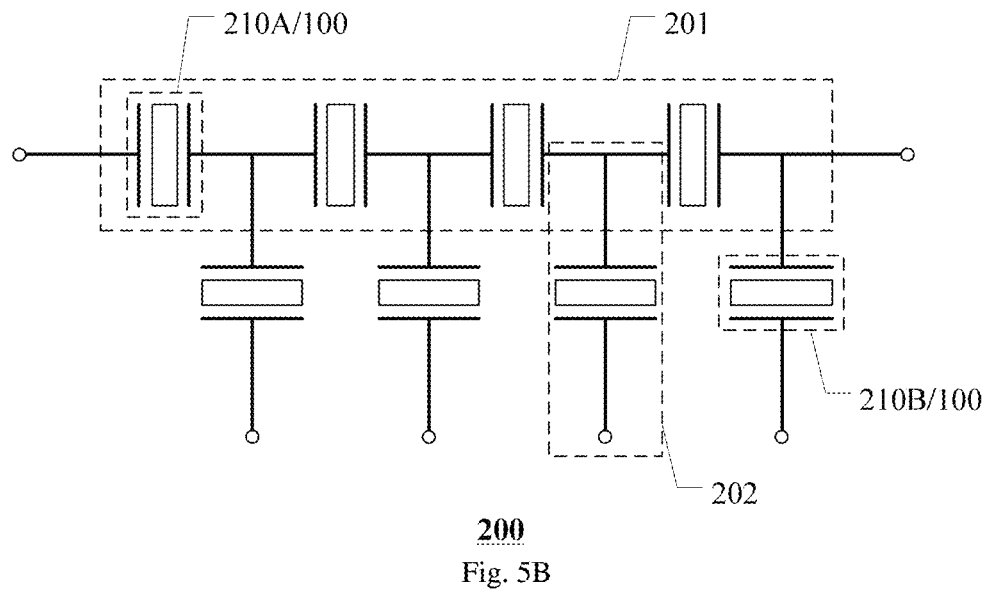
FIG. 5B is an equivalent circuit diagram of a filter provided by an embodiment of the present disclosure.

An embodiment of the present disclosure further provides a filter. FIG. 5A is a schematic diagram of a filter provided by an embodiment of the present disclosure; FIG. 5B is an equivalent circuit diagram of a filter provided by an embodiment of the present disclosure. As illustrated by FIGS. 5A and 5B, the filter 200 includes a plurality of resonators 210, and the plurality of resonators 210 includes at least one of the above-mentioned surface acoustic wave resonators 100. Because the surface acoustic wave resonator mentioned above has a small size, the filter can also reduce the size of the filter by adopting the surface acoustic wave resonator mentioned above, thereby achieving the miniaturization design of the filter.

In some examples, as illustrated by FIG. 5A, the plurality of resonators 210 includes a plurality of the above-mentioned surface acoustic wave resonators 100; the plurality of surface acoustic wave resonators 100 includes a first surface acoustic wave resonator 100A and a second surface acoustic wave resonator 100B arranged adjacent to each other in the first direction X. The first surface acoustic wave resonator 100A and the second surface acoustic wave resonator 100B share one groove 140. Therefore, the filter can further reduce a size of the filter by sharing one groove with two adjacent surface acoustic wave resonators, and further achieve the miniaturization of the filter.

In some examples, as illustrated by FIGS. 5A and 5B, the above resonators 210 can be divided into series resonators 210A and parallel resonators 210B; in this case, the filter 200 includes a series branch 201 and N parallel branches 202.

The series branch 201 includes M series resonators 210A, and each of the parallel branches 202 includes at least one parallel resonator 210B. The M series resonators 210A in the series branch 201 are arranged in series, a first end of each of the parallel branches 202 is grounded, a second end of each of the parallel branches 202 is connected to the series branch 201, and both M and N are positive integers greater than or equal to 2. The M series resonators 210A and the parallel resonators 210B in the N parallel branches 202 all adopt the above-mentioned surface acoustic wave resonator 100. Therefore, the filter can fully achieve the miniaturization design of the device.

Figure 6:
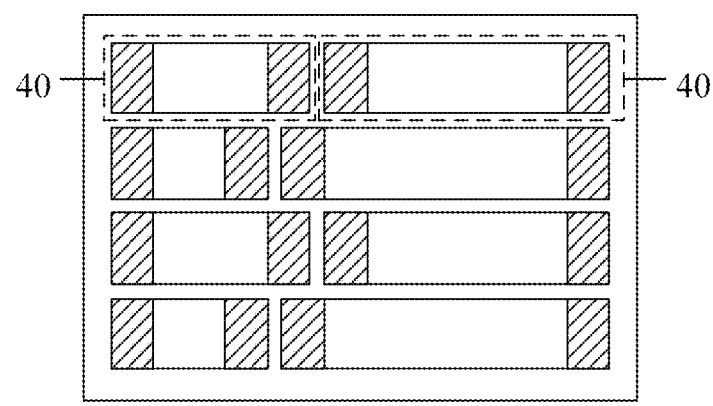
FIG. 6 is a schematic plan view of a filter.

FIG. 6 is a schematic plan view of a filter. As illustrated by FIG. 6, the filter includes a plurality of resonators 50, and the resonators 50 adopt the surface acoustic wave resonators 40 as illustrated by FIG. 1. Referring to FIG. 5A and FIG. 6, the filter shown in FIG. 5A effectively reduces the size of the filter and realizes the miniaturization of the filter by sharing one groove with two adjacent surface acoustic wave resonators.

Figure 7:
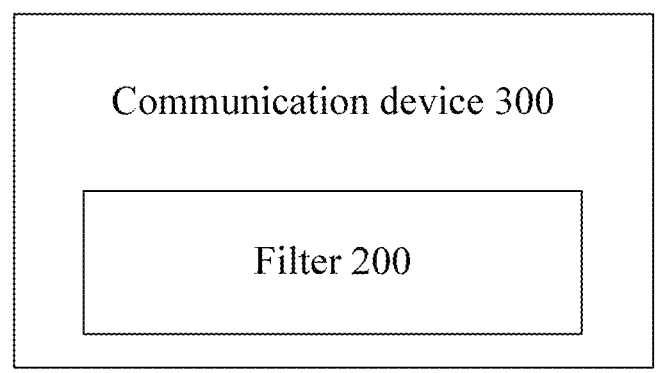
FIG. 7 is a schematic diagram of a communication device provided by an embodiment of the present disclosure.

An embodiment of the present disclosure also provides a communication device. FIG. 7 is a schematic diagram of a communication device provided by an embodiment of the present disclosure. As illustrated by FIG. 7, the communication device 300 includes the filter 200 described above. Because the communication device includes the above filter, the communication device also has higher performance and lower cost.

In some examples, the above-mentioned communication devices include, but are not limited to, intermediate products such as RF (radio frequency) front end, filter and amplification module, and also terminal products such as smart phones, WIFI, unmanned aerial vehicles, etc.

Figure 8:
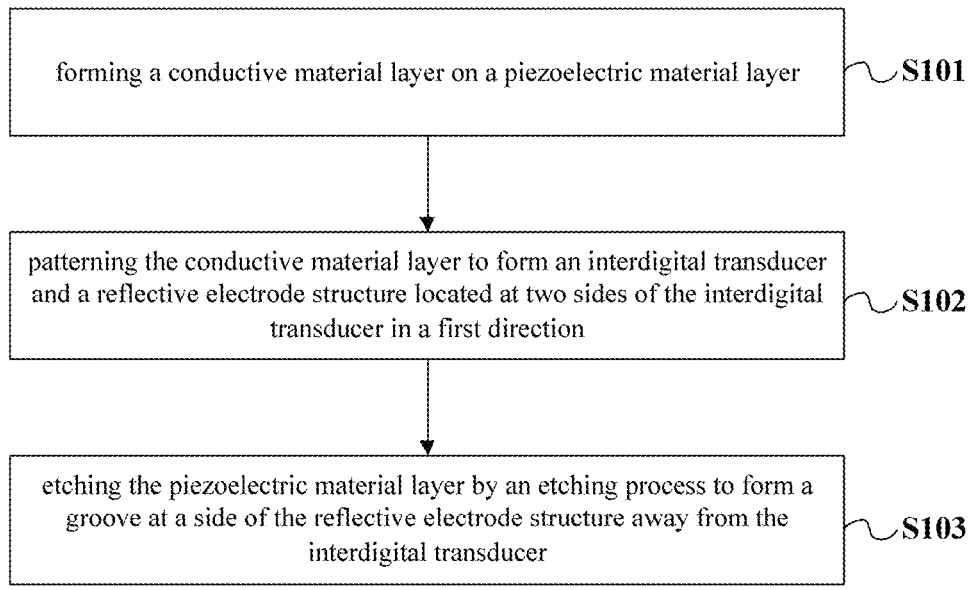
FIG. 8 is a flow chart of a manufacturing method of a surface acoustic wave resonator provided by an embodiment of the present disclosure.

An embodiment of the present disclosure further provides a manufacturing method of a surface acoustic wave resonator. FIG. 8 is a flow chart of a manufacturing method of a surface acoustic wave resonator provided by an embodiment of the present disclosure. As illustrated by FIG. 8, the manufacturing method includes the following steps S101-S103:

S101: forming a conductive material layer on a piezoelectric material layer;

S102: patterning the conductive material layer to form an interdigital transducer and a reflective electrode structure located at two sides of the interdigital transducer in a first direction;

S103: etching the piezoelectric material layer by an etching process to form a groove at a side of the reflective electrode structure away from the interdigital transducer.

In the manufacturing method of the surface acoustic wave resonator provided by the embodiment of the present disclosure, the piezoelectric material layer is etched by the etching process to form the groove at the side of the reflective electrode structure away from the interdigital transducer. In this case, the groove in the piezoelectric material layer can also play the role of reflecting the surface acoustic waves, so the size of the reflective electrode structure can be reduced. Therefore, the surface acoustic wave resonator manufactured by the manufacturing method of the surface acoustic wave resonator can achieve the same reflection effect while reducing the size of the surface acoustic wave resonator, thereby achieving the miniaturization design of the surface acoustic wave resonator. On the other hand, because the groove in the piezoelectric material layer may generate certain noise, by arranging the groove at the side of the reflective electrode structure away from the interdigital transducer, the generation of noise can be effectively suppressed, and the groove and the reflective electrode structure can play a better role in reflecting surface acoustic waves together.

In some examples, the piezoelectric material layer includes piezoelectric crystal or piezoelectric ceramic. Of course, the embodiments of the present disclosure include but are not limited thereto, and the piezoelectric material layer can also be other types of piezoelectric materials.

In some examples, the material of the piezoelectric material layer may be one or more selected from the group consisting of aluminum nitride (AlN), doped aluminum nitride (doped ALN), zinc oxide (ZnO), lead zirconate titanate (PZT), lithium niobate (LiNbO$_3$), quartz, potassium niobate (KNbO$_3$) and lithium tantalate (LiTaO$_3$).

In some examples, the material of the conductive material layer may include one or more selected from the group consisting of gold, tungsten, silver, titanium, platinum, aluminum, copper and molybdenum. Of course, the embodiments of the present disclosure include but are not limited thereto, and the material of the interdigital transducer can also be other conductive materials.

In some examples, a wet etching process can be used to etch the piezoelectric material layer to form the groove at a side of the reflective electrode structure away from the interdigital transducer.

In some examples, the depth of the groove can be adjusted by controlling the parameters of the etching process.

In some examples, a depth of the groove in the direction perpendicular to the piezoelectric material layer ranges from 0.05 L to 0.1 L, and L is the period length of the interdigital transducer. Therefore, the surface acoustic wave resonator can make the groove have a better reflection effect on surface acoustic waves, and can effectively suppress the generation of noise. In addition, in the case where the depth of the groove in the direction perpendicular to the piezoelectric material layer ranges from 0.05 L to 0.1 L, the surface acoustic wave resonator also has a higher quality factor. It should be noted that the above-mentioned period length L=2 (a+b), a is the width of the strip-shaped electrode (that is, the above-mentioned first strip-shaped electrode portion or second strip-shaped electrode portion) in the interdigital transducer, and b is the width of the interval between two adjacent strip-shaped electrodes.

In some examples, the depth of the groove in the direction perpendicular to the piezoelectric material layer ranges from 80 nm to 120 nm, for example, 100 nm. Therefore, the surface acoustic wave resonator can make the groove have a better reflection effect on surface acoustic waves, and can effectively suppress the generation of noise. In addition, in the case where the depth of the groove in the direction perpendicular to the piezoelectric material layer ranges from 80 nm to 120 nm, the surface acoustic wave resonator also has a higher quality factor.

Figure 9:
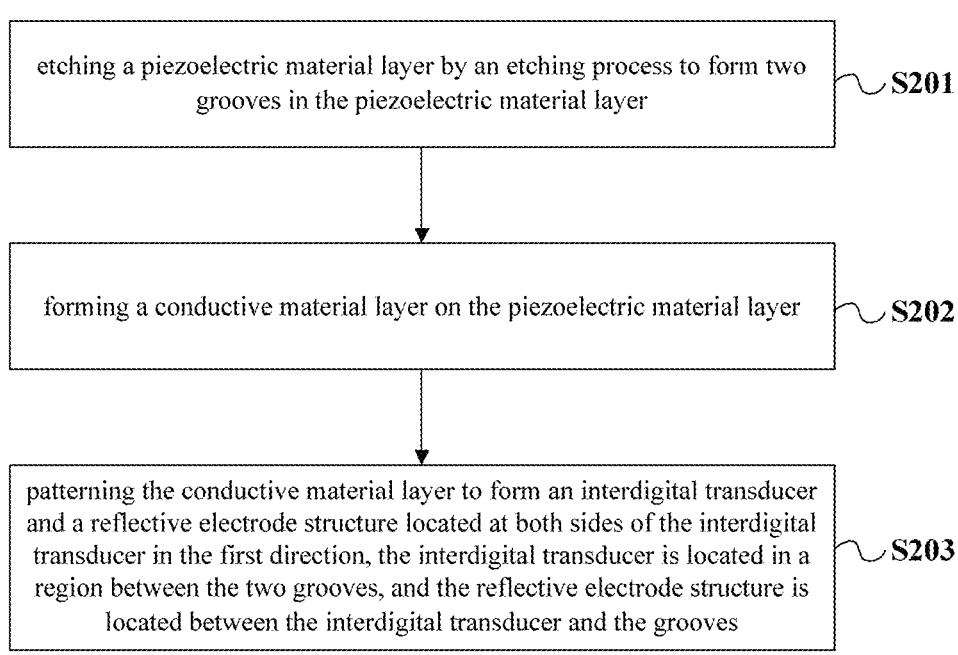
FIG. 9 is a flow chart of a manufacturing method of a surface acoustic wave resonator provided by an embodiment of the present disclosure.

Another embodiment of the present disclosure further provides a manufacturing method of a surface acoustic wave resonator. FIG. 9 is a flow chart of a manufacturing method of a surface acoustic wave resonator provided by an embodiment of the present disclosure. As illustrated by FIG. 9, the manufacturing method includes the following steps S201-S203:

S201: etching a piezoelectric material layer by an etching process to form two grooves in the piezoelectric material layer;

S202: forming a conductive material layer on the piezoelectric material layer;

S203: patterning the conductive material layer to form an interdigital transducer and a reflective electrode structure located at both sides of the interdigital transducer in the first direction, the interdigital transducer is located in a region between the two grooves, and the reflective electrode structure is located between the interdigital transducer and the grooves.

In the manufacturing method of the surface acoustic wave resonator provided by the embodiment of the present disclosure, the piezoelectric material layer is etched by the etching process to form two grooves in the piezoelectric material layer, the subsequently formed interdigital transducer is located in the region between the two grooves, and the subsequently formed reflective electrode structure is located between the interdigital transducer and the grooves. In this case, the grooves in the piezoelectric material layer can also play a role in reflecting the surface acoustic waves, so the size of the reflective electrode structure can be reduced. Therefore, the surface acoustic wave resonator manufactured by the manufacturing method of the surface acoustic wave resonator can achieve the same reflection effect while reducing the size of the surface acoustic wave resonator, thereby achieving the miniaturization design of the surface acoustic wave resonator. On the other hand, because the grooves in the piezoelectric material layer may generate certain noise, by arranging the grooves at a side of the reflective electrode structure away from the interdigital transducer, the generation of noise can be effectively suppressed, and the groove and the reflective electrode structure can play a better role in reflecting surface acoustic waves together.

It is to be Noted that:

(1) In the drawings of the embodiments of the present disclosure, only the structures related to the embodiments of the present disclosure are involved, and other structures may refer to the common design(s).

(2) In case of no conflict, features in one embodiment or in different embodiments of the present disclosure can be combined.

What have been described above are only specific implementations of the present disclosure, the protection scope of the present disclosure is not limited thereto, and easily conceivable changes or substitutions should be covered within the protection scope of the present disclosure. Therefore, the protection scope of the present disclosure should be based on the protection scope of the claims.

The invention claimed is:

1. A surface acoustic wave resonator, comprising:
   a piezoelectric material layer, comprising a first region and two second regions arranged in a first direction;
   an interdigital transducer, located at a side of the piezoelectric material layer; and
   a reflective electrode structure, arranged in the same layer as the interdigital transducer,
   wherein the first region is located between the two second regions, the interdigital transducer is located in the first region, and the reflective electrode structure is located in the second regions,
   the surface acoustic wave resonator further comprises a groove located in the piezoelectric material layer, the groove is located in the second regions and at a side of the reflective electrode structure away from the interdigital transducer in the first direction,
   the reflective electrode structure comprises a plurality of reflective strip-shaped electrode portions, and the plurality of reflective strip-shaped electrode portions are arranged along the first direction, the groove is located at a side of the plurality of reflective strip-shaped electrode portions and intervals among the plurality of reflective strip-shaped electrode portions away from the interdigital transducer in the first direction, and
   a depth of the groove in a direction perpendicular to the piezoelectric material layer ranges from 0.05 L to 0.1 L, where L is a period length of the interdigital transducer.

2. The surface acoustic wave resonator according to claim 1, wherein a depth of the groove in a direction perpendicular to the piezoelectric material layer ranges from 80 nm to 120 nm.

3. The surface acoustic wave resonator according to claim 1, wherein a size of the groove in the first direction is greater than 0.1 L, where L is a period length of the interdigital transducer.

4. The surface acoustic wave resonator according to claim 1, wherein the interdigital transducer comprises:
   a first electrode, comprising a plurality of first strip-shaped electrode portions; and
   a second electrode, comprising a plurality of second strip-shaped electrode portions,
   wherein each of the plurality of first strip-shaped electrode portions extends along a second direction, each of the plurality of second strip-shaped electrode portions extends along the second direction, the plurality of first strip-shaped electrode portions and the plurality of second strip-shaped electrode portions are arranged in the first direction, and the second direction intersects with the first direction.

5. The surface acoustic wave resonator according to claim 4, wherein a size of the groove in the second direction is approximately the same as a size of the interdigital transducer in the second direction.

6. The surface acoustic wave resonator according to claim 1, wherein a size of the groove in the first direction is larger than a size of an interval between two adjacent ones of the plurality of reflective strip-shaped electrode portions in the first direction.

7. The surface acoustic wave resonator according to claim 6, wherein a number of the plurality of reflective strip-shaped electrode portions comprised in the reflective electrode structure in each of the second regions ranges from 10 to 20.

8. The surface acoustic wave resonator according to claim 1, wherein a material of the piezoelectric material layer comprises piezoelectric crystal or piezoelectric ceramic.

9. The surface acoustic wave resonator according to claim 1, wherein a material of the interdigital transducer comprises one or more selected from the group consisting of gold, tungsten, silver, titanium, platinum, aluminum, copper and molybdenum.

10. A surface acoustic wave resonator, comprising:
    a piezoelectric material layer, comprising a first region and two second regions arranged in a first direction;
    an interdigital transducer, located at a side of the piezoelectric material layer; and
    a reflective electrode structure, arranged in the same layer as the interdigital transducer,
    wherein the first region is located between the two second regions, the interdigital transducer is located in the first region, and the reflective electrode structure is located in the second regions,
    the surface acoustic wave resonator further comprises a groove located in the piezoelectric material layer, the groove is located in the second regions and at a side of the reflective electrode structure away from the interdigital transducer in the first direction, the reflective electrode structure comprises a plurality of reflective strip-shaped electrode portions, and the plurality of reflective strip-shaped electrode portions are arranged along the first direction, the groove is located at a side of the plurality of reflective strip-shaped electrode portions and intervals among the plurality of reflective strip-shaped electrode portions away from the interdigital transducer in the first direction, and wherein a size of the reflective electrode structure in the first direction ranges from 8 microns to 12 microns.

11. A surface acoustic wave resonator, comprising:

a piezoelectric material layer, comprising a first region and two second regions arranged in a first direction;

an interdigital transducer, located at a side of the piezoelectric material layer; and a reflective electrode structure, arranged in the same layer as the interdigital transducer, wherein the first region is located between the two second regions, the interdigital transducer is located in the first region, and the reflective electrode structure is located in the second regions, the surface acoustic wave resonator further comprises a groove located in the piezoelectric material layer, the groove is located in the second regions and at a side of the reflective electrode structure away from the interdigital transducer in the first direction, the reflective electrode structure comprises a plurality of reflective strip-shaped electrode portions, and the plurality of reflective strip-shaped electrode portions are arranged along the first direction, the groove is located at a side of the plurality of reflective strip-shaped electrode portions and intervals among the plurality of reflective strip-shaped electrode portions away from the interdigital transducer in the first direction, a size of the groove in the first direction is larger than a size of an interval between two adjacent ones of the plurality of reflective strip-shaped electrode portions in the first direction, and wherein the number of the plurality of reflective strip-shaped electrode portions comprised in the reflective electrode structure in each of the second regions ranges from 14 to 16.

12. A filter, comprising a plurality of resonators, wherein the plurality of resonators comprises at least one surface acoustic wave resonator according to claim 1.

13. The filter according to claim 12, wherein the plurality of resonators comprise a plurality of surface acoustic wave resonators, the plurality of surface acoustic wave resonators comprises a first surface acoustic wave resonator and a second surface acoustic wave resonator arranged adjacent to each other in the first direction, the first surface acoustic wave resonator and the second surface acoustic wave resonator share one groove.

14. A communication device, comprising the filter according to claim 12.

* * * * *